(12) United States Patent
Polzer

(10) Patent No.: US 9,759,759 B2
(45) Date of Patent: Sep. 12, 2017

(54) APPARATUS AND METHOD FOR SENSING A LEAKAGE CURRENT BETWEEN FIRST AND SECOND LOCATIONS IN A SINGLE WIRE EARTH RETURN CIRCUIT

(71) Applicant: VALE S.A., Rio de Janeiro (BR)

(72) Inventor: Benjamin David Polzer, Ontario (CA)

(73) Assignee: VALE S.A., Rio de Janeiro (BR)

( * ) Notice: Subject to any disclaimer, the term of this patent is extended or adjusted under 35 U.S.C. 154(b) by 0 days.

(21) Appl. No.: 14/800,403

(22) Filed: Jul. 15, 2015

(65) Prior Publication Data

US 2017/0016947 A1     Jan. 19, 2017

(51) Int. Cl.
*G01R 31/14*     (2006.01)
*G01R 31/02*     (2006.01)
*H02H 1/00*     (2006.01)
*G01R 15/20*     (2006.01)

(52) U.S. Cl.
CPC ......... *G01R 31/025* (2013.01); *H02H 1/0007* (2013.01); *G01R 15/20* (2013.01)

(58) Field of Classification Search
CPC .. G01R 31/026; G01R 31/041; G01R 31/025; G01R 31/021; G01R 19/00; G01R 21/06; G01R 23/02; G01R 27/18; G01R 31/024; G01R 31/2839; G01R 35/00; G01R 35/005; G01R 19/145; H02H 3/16; H02H 3/17; H02H 3/337; H02H 5/105; H02H 7/0833; H02H 9/00; H02H 3/332; H02M 7/53871

See application file for complete search history.

(56) References Cited

U.S. PATENT DOCUMENTS

| | | | | |
|---|---|---|---|---|
| 3,794,884 A | * | 2/1974 | Sircom | H02H 3/331 361/113 |
| 4,001,646 A | * | 1/1977 | Howell | H02H 3/331 361/113 |
| 4,809,123 A | * | 2/1989 | Allington | G01R 19/16571 324/509 |
| 8,526,143 B2 | * | 9/2013 | Kinsel | H02H 3/162 361/42 |
| 2003/0063419 A1 | * | 4/2003 | Nemir | H02H 3/05 361/78 |

\* cited by examiner

*Primary Examiner* — Vinh Nguyen
(74) *Attorney, Agent, or Firm* — Arent Fox LLP

(57) ABSTRACT

An apparatus and method for sensing a leakage current along a primary conductor are provided. A first fault detection module is deployed at a first location along the primary conductor and a second driver module is deployed at a second location along the conductor, where the conductor passes through current sensors at each of the modules. The modules are further linked by a safety cable, which also passes through the current sensors. The driver module drives a compensation current in the safety cable to drive the net current passing through the driver current sensor to zero. The fault sensing module senses the net current passing through its current sensor. When the sensed current deviates significantly from zero, the fault sensing module generates a leakage current indication signifying a potential ground fault between the two modules.

22 Claims, 6 Drawing Sheets

APPARATUS AND METHOD FOR SENSING A LEAKAGE CURRENT BETWEEN FIRST AND SECOND LOCATIONS IN A SINGLE WIRE EARTH RETURN CIRCUIT

FIELD OF THE DISCLOSURE

The present disclosure relates generally to ground fault detection in electrical circuits, and more particularly to ground fault detection and fault interruption in ground-return electrical circuits.

BACKGROUND

In the fields of geophysics, and environmental and civil engineering, electrical ground surveys are conducted to map the resistivity and chargeability of a ground subsurface. Such surveys are sometimes referred to as ground resistivity surveys or ground induced polarization surveys. Soil resistivity measurements may be used in a sub-surface geophysical survey to identify ore locations, depth to bedrock and other geological phenomena.

Ground resistivity surveys typically involve injecting an electric current into the ground through a first electrode driven by a transmitter. The current in the ground is sourced through a second electrode inserted into the ground at some distance away from the first electrode. This type of circuit is referred to as a ground-return circuit, or sometimes an earth-return circuit.

An example of a ground-return surveying system is shown in FIG. 1. System 100 includes a transmitter 102, a first electrode 104 connected to the transmitter 102 via current wire 108 for driving an electrical current into the ground 150, and a second electrode 106 inserted into the ground at a spaced apart location from first electrode 104 and connected to the transmitter 102 via a second current wire 109. Current flows between first electrode 104 and second electrode 106 in the ground to complete the circuit.

The distance range of 50 m to 5000 m indicated in FIG. 1 between transmitter 102 and electrode 104 is only an example range. An electrode may be positioned more closely or farther away from a transmitter or another electrode at distances outside of this example range.

Such surveys are often conducted in a "pole-dipole" configuration where one electrode is located far from the survey area and is often called the "infinite" electrode. With the infinite electrode fixed, the second electrode is moved to different positions in the survey area while potential differences are measured between electrodes in an array of potential electrode pairs. The removal of the infinite electrode from the survey area typically improves the depth of search and simplifies the processing. Whatever the motivation, such surveys are often conducted with current to infinite electrode distances of several kilometers or more.

The potential difference measured between electrodes is a function of the resistivity structure of the ground and the injected current. The injected current is in turn directly proportional to the applied voltage and inversely proportional to the circuit resistance, which can be thought of as the series resistance of the ground circuit and the contact resistance of both current electrodes. Particularly in situations where the ground resistivity is low but the surface contact resistance is high, it is necessary to provide high voltages to drive sufficient current to in turn provide for sufficient data quality and survey speed. Transmitters capable of over 4000V are readily available and routinely used. Such high voltages can pose a significant hazard to crew members and the public at large.

The current wire connecting an electrode to a transmitter can consist of a single conductor, such as a stranded copper wire insulated with a polyethylene jacket. The wire is usually deployed on the ground from small reels running along routes of convenience such as along cut lines, paths, roads, etc. Because of the large distances, it is usually necessary to cut and splice various sections of the current wire together to form a single run.

While operating the transmitter, the current wire can pose a significant hazard to the crew and the public at large as well as to wildlife and domesticated livestock. Voltages as high as several thousand volts can exist between the wire and ground beneath it. While the current wire is insulated with a wire jacket, splices, cracks and other breaches of the insulation can allow such high voltages to leak current to ground. A leak to ground is referred to as a "ground fault". The risk of a ground fault is usually higher when the ground and wire are wet. The problem is most acute when a person is holding or otherwise touching the wire and their feet are in contact with wet ground since a grounding path exists through the arm and across the heart of the person. In such a case, a leakage current as low as 5 milliampere (mA) is considered hazardous.

Hazard mitigation efforts for resistivity surveys usually include posting signage alerting the crew and public to the high-voltage hazard, performing traffic control into the survey area, and implementing communication protocols for ensuring that the crew is aware of the status of the transmitter at all times. Despite these efforts, significant risk remains to both the crew and the public. It is often impractical to control access to such a wide area covered by the current wire. Furthermore, wildlife and livestock sometimes chew current wires thereby breaching the insulation. In addition, people occasionally cut and steal the current wire for its use as wire or for its value as scrap copper. All of these activities expose people and animals to potentially fatal electric shock.

SUMMARY

In one aspect, the present disclosure is directed to an apparatus for sensing a leakage current between first and second locations along a primary conductor carrying a primary current, the apparatus comprising: a driver module positioned at the second location along the primary conductor, comprising: a closed-loop driver current sensor for sensing a first net current passing through the sensor, the first net current comprising current in one or more windings of the primary conductor and current in one or more windings of a safety conductor, where each winding passes through the driver current sensor, wherein the driver module provides a compensation current in the safety conductor at the driver current sensor so that the total current passing through the driver current sensor in the one or more windings of the primary conductor is compensated by the total current passing through the sensor in the one or more windings of the safety conductor to drive the first net current at the driver current sensor to approximately zero; and a fault sensing module positioned at the first location along the primary conductor, comprising: a fault current sensor for sensing a second net current passing through the fault current sensor, the second net current comprising current in one or more windings of the primary conductor and current in one or more windings of the safety conductor, where each winding passes through the fault current sensor, the fault current sensor providing an output signal proportional to the second net current; and a fault detector for receiving the output signal of the fault current sensor and generating a leakage current indication in response to the second net current at the fault sensing module differing from approximately zero by a specified threshold.

In another aspect, the present disclosure is directed to a method for sensing a leakage current between first and second locations along a primary conductor carrying a primary current, the method comprising: sensing a first net current passing through a current sensor of a driver module positioned at the second location along the primary conductor, the first net current comprising current in one or more windings of the primary conductor and current in one or more windings of a safety conductor, where each winding at the driver current sensor passes through the sensor; generating a compensation current in the safety conductor to drive the first net current at the driver current sensor to approximately zero; sensing a second net current passing through a current sensor of a fault sensing module positioned at the first location along the primary conductor, the second net current comprising current in one or more windings of the primary conductor and current in one or more windings of the safety conductor, where each winding at the fault current sensor passes through the sensor; and generating a leakage current indication in response to the sensed second net current at the fault sensing module differing from approximately zero by a specified threshold.

BRIEF DESCRIPTION OF THE DRAWINGS

The present disclosure will be better understood having regard to the drawings in which.

DETAILED DESCRIPTION

The present disclosure is directed to embodiments that provide an enhancement to one or both of safety and security in an electrical system by continuously monitoring hazardous ground faults along any length of current conductor. A circuit may be promptly interrupted in the event that a ground fault is detected. In addition to its basic safety function, the present disclosure also provides embodiments that enable monitoring and storing of a ground-fault detection signal so that near-fault conditions can be identified after-the-fact. The detection of near-fault conditions can warn of low-level leakage through poorly insulated splices, worn or damaged wire insulation, etc. so that the wire can be repaired or replaced before significant tripping of the interrupter interferes with survey production or safety.

In some aspects, the present disclosure is directed to a ground fault detection system for detecting current leakage from a current wire or line to ground in a ground-return circuit. In some embodiments, the ground fault detection system comprises two modules. A first fault detection module is deployed near a transmitter and accepts a wire to one of the transmitter outputs. A second driver module is deployed near a distant current electrode to be driven by the transmitter. The two modules are linked by the primary current wire as well as by a safety cable. The first fault sensing module monitors a sensor signal, which deviates from zero in the event of a potentially dangerous leakage of current between the current wire and the earth at any place between the two modules. The fault sensing module may signal a circuit interrupter to disconnect the transmitter from the primary current wire when a significant deviation from zero of the sensor output at the fault sensing module is detected.

The present disclosure also provides other features, which are described herein. Additional features and advantages of the present disclosure will be appreciated by those skilled in the art.

Although the present disclosure provides embodiments for detecting ground faults in electrical conductors in ground-return electrical circuits, the present disclosure is not intended to be limited to this type of application. Rather, the teachings of the present disclosure may be used in other applications and in other fields.

The various features and components of the present disclosure are now described with reference to the Figures.

Figure 1:
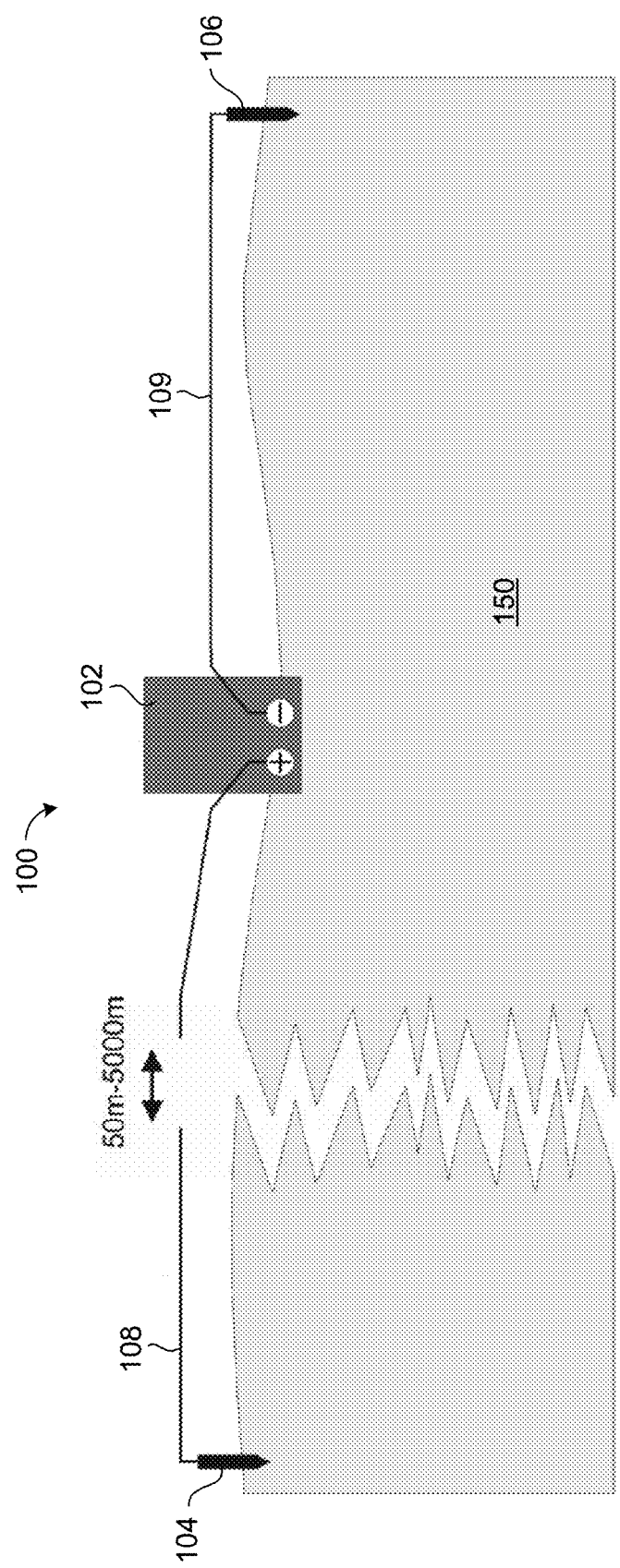
FIG. 1 is a diagram of a ground-return system.
Figure 2:
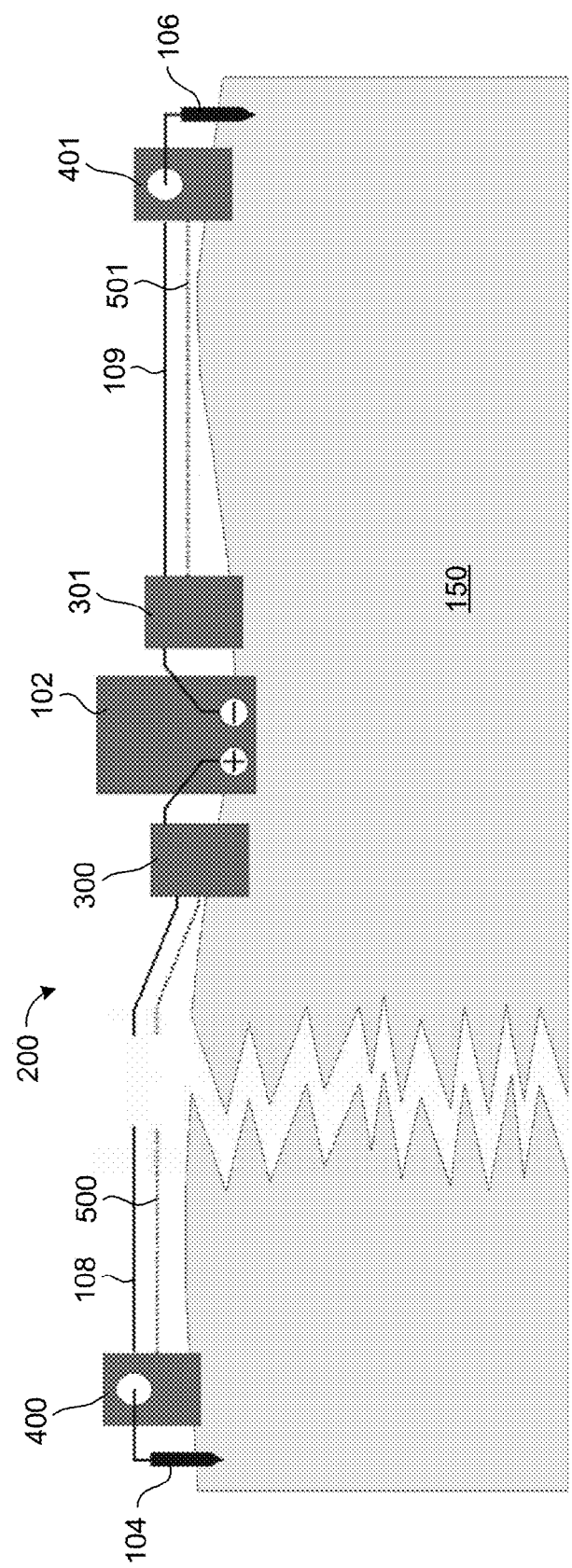
FIG. 2 is a diagram of a fault detection system according to an embodiment of the present disclosure.

FIG. 2 shows an example embodiment of a fault detection system 200 according to the present disclosure in combination with a ground-return surveying system. The ground-return surveying system is similar to the system 100 shown in FIG. 1 having first and second electrodes 104, 106 connected to a transmitter 102 via a primary electrical conductor, such as current wires 108 and 109.

Although the primary conductor is referred to herein as a current wire, other types of conductors such as cables, electrical busses, etc. are also contemplated. Therefore the use of the term wire is generally intended to include all other types of suitable conductors. Furthermore, although current wire 108 (and 109) is shown as a single continuous conductor, in some embodiments, current wire 108 may comprise two or more separate electrical conductors (e.g. wire, cable, bus, etc.) electrically coupled to one another. In some embodiments, the current wire may comprise several lengths of wire or cable spliced together in order to cover long distances.

Fault detection system 200 may comprise a fault sensing module 300, which may be positioned at a first position along current wire 108. System 200 may also comprise a driver module 400, which may be positioned at a second position along current wire 108. In the embodiment shown, the first position is at or near transmitter 102 and the second position is at or near electrode 104. Fault sensing module 300 and driver module 400 may be electrically connected by a safety cable, such as safety cable 500, and may cooperate to detect a ground fault in current wire 108 between the first and second positions along current wire 108.

It is to be noted that fault detection system 200 may comprise one or more other sets of fault sensing and driver modules for providing fault detection along one or more other primary conductors, such as fault sensing module 301 and driver module 401 along current wire 109 connected to another (e.g. negative) terminal of transmitter 102. Modules 301 and 401 may be connected by way safety cable 501.

Figure 3:
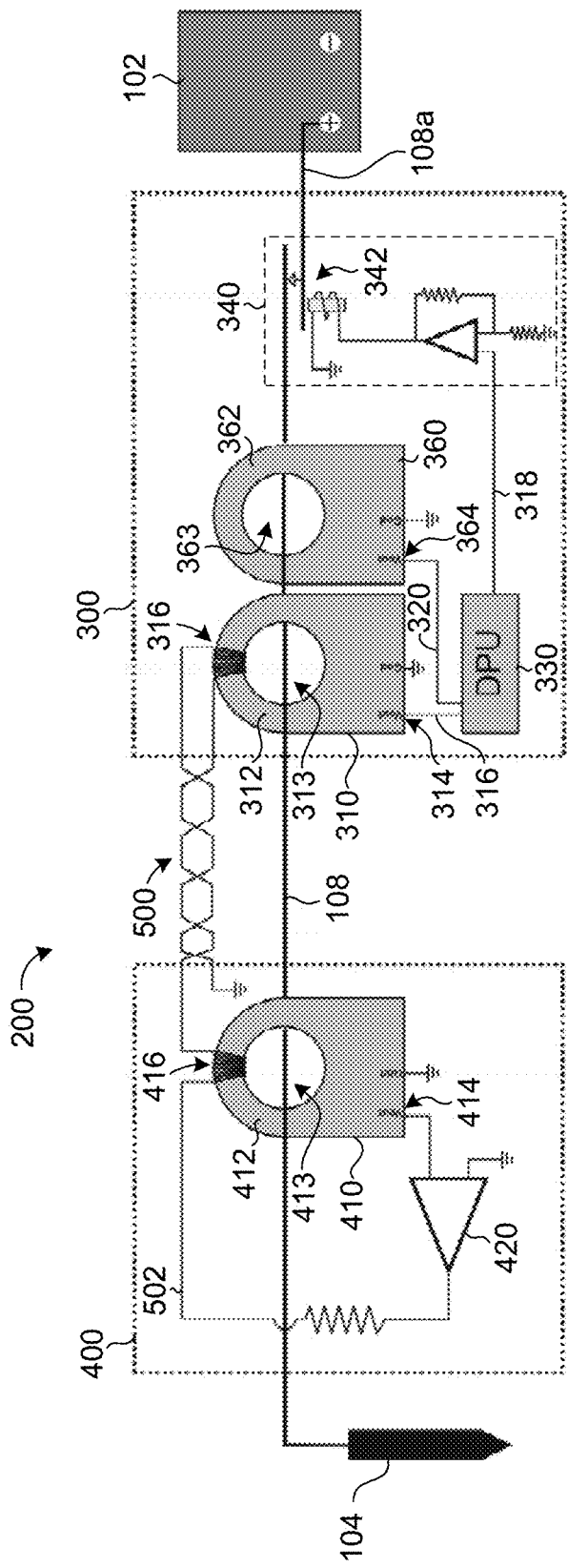
FIG. 3 is a detailed diagram of a fault detection system according to an embodiment of the present disclosure.

FIG. 3 shows an example embodiment of a fault detection system 200 in further detail. Fault sensing module 300 and driver module 400 are shown as being relatively close together for illustrative purposes, but in practice the modules may typically be separated by a much larger distance, including up to several kilometers.

Fault sensing module 300 may comprise a sensor 310 for measuring or sensing one or more properties relating to the primary current flowing in the current wire 108 at the location of fault sensing module 300 (e.g. first location). Sensor 310 may be any suitable type of current sensor capable of sensing a net current flowing in one or more conductors passing through the device. Entry and exit of the conductors to and from the device may take the form of a number of input and output terminals, one set for each conductor or an opening through which all independent conductors pass. Commonly, this is achieved by devices employing a toroidal magnetic core through which the conductors pass but alternative arrangements may be used such as those employing the summed outputs of individual current sensors based on other technologies, the outputs of which are summed. In some embodiments of the present disclosure, the conductors pass through an opening 313 defined both by an internal magnetically-permeable toroid and externally by the body of the sensor, which generates a signal proportional to the net current of all conductors passing through the opening. Each conductor may have one or more windings resulting in one or more passes through the opening with each pass through the opening contributing to the net current. Current wire 108 in FIG. 3 passes through opening 313 in sensor 310 once (i.e. one winding). In devices using multiple input and output terminals, additional windings may be achieved by connecting an output back to an input.

Although some embodiments are described as having one or more current sensors comprising a magnetically permeable core through which the primary and safety conductors pass, this is not meant to be limiting. In other embodiments, one or more current sensors without a magnetically permeable core may be used.

In some embodiments, a current sensor may be of a type having a magnetically permeable core for concentrating the magnetic flux generated by the current to be measured. The core typically circumscribes the opening of the sensor through which the one or more conductors pass. This type of sensor includes but is not limited to current transformers and current transducers. A magnetically permeable core may be a solid core or split core (having a gap in the core). Furthermore, the core may be toroidal, rectangular, or any other suitable shape. Types of current sensors having a magnetically permeable core include but are not limited to flux gate current sensors and open loop/closed loop Hall Effect current sensors.

In one embodiment, a flux gate current sensor comprises a flux gate acting as a magnetic field detector. A magnetic field in a magnetic core, such as a toroid, generated by the primary current (Ip) may counteracted by a compensating secondary current (Is) generated by an integrator. A flux gate detects magnetic fields in the core from 0 Hz (i.e. direct current, DC) up to 100 Hz at sub parts per million (ppm) levels. In response, the integrator generates the compensating secondary current (Is) to compensate (nullify) the detected magnetic fields. At higher frequencies, a feedback winding detects magnetic fields in the core at ppm levels. In response, the integrator generates compensating secondary current to compensate these detected magnetic fields as well. The secondary current (Is) is proportional to the primary current (Ip) with based on the ratio of the number of windings of the primary conductor to the number of windings of the secondary conductor carrying the secondary current. Danisense A/S of Denmark sells various different flux gate current sensors, which may be employed in embodiments of the present disclosure.

In other embodiments, a current sensor not having a magnetically permeable core may be used. Examples of this type of sensor include but are not limited to core-less open loop Hall Effect current sensors and Rogowski current sensors.

The following embodiments are described as having current sensors that have magnetically permeable cores. However, these embodiments are not meant to be limiting.

In the embodiment shown in FIG. 3, sensor 310 may be a current transducer having a magnetically permeable core 312 defining an opening 313 therethrough. In some embodiments, a current sensor may be a high-fidelity transducer. Current sensor 310 may be configured to output 314 a signal providing an instantaneous indication or representation of a total current flowing through all the conductors passing through the opening 313 (e.g. in the core 312) of the sensor 310, including current attributed to the multiple windings of any single conductor. In the embodiment of FIG. 3, current wire 108 passes through opening 313 once and safety wire 502 passes through opening 313 multiple times due to the multiple windings 316. An output signal 314 of current sensor 310 may be proportional to the sensed current.

A current sensor may be configured to output the representative signal by concentrating a magnetic flux created by the primary current in a magnetic circuit, such as core 312, and measuring or sensing the flux using a flux gate, a Hall Effect device, or any other suitable mechanism (not shown). The output from the magnetic flux sensing device may then be signal conditioned to provide the instantaneous representation of the primary current.

Driver module 400, which is positioned at a second location along current wire 108, may comprise a sensor 410 for measuring or sensing one or more properties relating to the primary current flowing in the current wire 108 at the location of driver module 400. In some embodiments, sensor 410 may be a current sensor similar to or the same as current sensor 310 at fault sensing module 300. Current sensor 410 may thus include magnetically permeable core 412 that circumscribes opening 413 therethrough for receiving current wire 108. In the embodiment of FIG. 3, current wire 108 passes through opening 413 once and safety wire 502 passes through opening 413 multiple times due to the multiple windings 416. Current sensor 410 may also include an output 414 for outputting a signal indicative of the total current flowing through all conductors flowing through the opening in 410.

While the present embodiment shows one winding of the current wire 108 whereby it penetrates each of the openings 313 and 413 of sensors 310 and 410 only once, other embodiments may have a current wire with multiple windings so as to increase the sensitivity of the sensor to current in the current wire.

In addition, driver module 400 may comprise a power source, to power driver circuit 420, for generating a current in a separate conductor, which in this embodiment is safety wire 502, which forms safety cable 500. This current may be referred to as a compensation current to distinguish it from the primary current in current wire 108.

Two lengths of safety wire 502 extend between and connect driver module 400 and fault sensing module 300. The two lengths of wire 502 form safety cable 500, and may be in the form of a twisted pair as shown in FIG. 3. Safety wire 502 may be passed through opening 413 of sensor 410 at fault sensing module 400, forming one or more windings 416 around core 412, one windings being the case of a single pass of safety wire 502 through opening 413 in sensor 410. Safety wire 502 may then extend to fault sensing module 300, where it may be passed through opening 313 of sensor 310 to form one or more windings 316 through opening 313. In some embodiments, the number of windings 316 is the same as the number of windings 416 at driver module 400 in order for the compensation current to drive the output of sensor 310 to approximately zero, as will be described below. Wire 502 may then extend back to driver module 300 and may be connected to the ground of the driver module 400. Although safety wire 502 is shown as a single continuous conductor, in some embodiments, wire 502 may comprise two or more separate electrical conductors spliced or otherwise coupled to one another.

The compensation current generated in safety wire 502 is used to provide a secondary contribution to the net current passing through opening 413 in driver current sensor 410 cancelling the primary contribution to the net current, each contribution being the current in each respective wire times the number of passes of that wire through the opening 413. In other words, a net current passing through opening 413 may comprise current in one or more windings of current wire 108 and current in one or more windings of safety wire 502.

Driver circuit 420 may be configured to control the compensation current based on output 414 from sensor 410. In some embodiments, driver circuit 420 may comprise an amplifier arranged in feedback in order to drive current into safety wire 502. Again, outputted signal 414 from sensor 410 may be proportional to the net current comprising current flowing through current wire 108 and safety wire 502 passing through opening 413.

In the embodiment of FIG. 3, driver module 400 may be configured as a zero flux current sensor so that the current driven in safety wire 502 by driver circuit 420 and through one or more windings 416 at opening 413 reduces or "drives" the net current flowing through opening 413, and thus the total magnetic flux in core 412, to approximately zero. In other words, the magnetic flux generated by the current in windings 416 in safety wire 502 is made to be approximately equal in amplitude (but opposite in direction) to the primary magnetic flux produced in core 412 by the primary current in current wire 108. Thus the primary current is cancelled (or "compensated") by the compensation current in windings 416 of safety wire 502. The compensation current is equivalent to the primary current in current wire 108 times the number of windings of current wire 108 around core 412 (not shown in this embodiment) divided by the number of turns in winding 416.

Therefore when there is no current leak in current wire 108 between fault sensing module 300 and driver module 400, the net current passing through each of openings 313, 413 of modules 300, 400 will be approximately the same (e.g. approximately zero), provided the number of windings 416 in the driver module 400 equals the number of windings 316 in the fault sensing module 300 and the number of windings of current wire 108 is the same in the driver module 400 and the fault sensing module 300. Therefore the compensation current in safety wire 502 in combination with the number of windings is sufficient to compensate the primary current in current wire 108 passing through both modules 300,400 when there is no current leak in current wire 108.

However, when a current leak exists in current wire 108 between modules 300,400, the primary current in wire 108 at driver module 400 will be different (e.g. lower) than the primary current in wire 108 at fault sensing module 300 due to the current leak. In such a situation, the compensation current in safety wire 502 at windings 316 will not be sufficient to cancel (e.g. reduce to zero) the current in current wire 108 at fault sensing module 300. Thus the net current passing through opening 313 will differ from approximately zero. As a result, output 314 at sensor 310 of fault sensing module 300 will be indicative of a non-zero net current.

When a current sensor is configured for zero flux operation, the sensor measures the compensation current to a winding around its core required to maintain the net current through the opening, and thus the magnetic flux in the core, at zero. Since such a sensor is usually operating near zero flux in the core, in some embodiments, the sensor is an intrinsically highly linear device (e.g. <1 parts per million (ppm)), has a wide operating temperature range (e.g. −40 C to 85 C), a wide frequency response (e.g. 0 Hz to 100 kHz) and low offsets (e.g. <20 ppm).

The compensation current required to cancel out the primary current in current wire 108 is proportional to the number of windings 416 at core 412. For example, if a current of 1 Ampere (A) is flowing through current wire 108 at driver module 400 and the number of windings at core 412 is 100, then a compensation current of approximately 10 mA will be needed to cancel the current in current wire 108.

At sufficiently low frequencies, the contributions to the reactance from the inductance and distributed capacitance between the twisted pair conductors (safety wires 502) of safety cable 500 is very small and the current will be the same everywhere in the safety wire 502 when no ground faults are occurring. However for a 50% duty-cycle waveform used in some electrical surveys, the inductive and capacitive reactance is significant during the rapid transitions in voltage from one level to another, which results in significant spikes in the null signal at each transition. However, these spikes do not represent ground faults. These spikes are typically only a small fraction of a millisecond in duration and may be removed by filtering and algorithmic techniques in some embodiments of the present disclosure so to not generate false fault detection indications.

Aside from noise, which is typically to be kept as low as possible, and the waveform transitions, the output 314 of sensor 310 at fault sensing module 300 may be maintained at zero while there are no current leaks and the change in current in current wire 108 is not too abrupt. Output 314 may be continuously sampled or otherwise monitored at a high rate. Suitable filtering and algorithmic analyses may be applied to the output signal of sensor 310 to be able to detect a current leak. A current leak may be detected when the output of sensor 310 differs from zero by a specified threshold. In particular, a threshold may be set at a value that corresponds to a specific current leak in current wire 108. In one example, the threshold may be set at 2 mA so as to avoid hazardous faults such as at the 5 mA level. However, a threshold for a current leak may be set to any other suitable value.

Still referring to FIG. 3, an output 314 of sensor 310 of fault sensing module 300 may be connected to fault detector 330, for example by connection 316. Fault detector 330 may be located at fault sensing module 300. In some embodiments, output 314 may be in digital format. Fault detector 330 may be configured to detect when an output signal from sensor 310 is above or below a threshold value. For example, detector 330 may be configured to identify when an output signal from sensor 310 indicates that a net current flowing through opening 313 in sensor 310 differs from zero by a threshold. Again, the net current may be the sum of the current flowing through windings of current wire 108 and the current flowing through windings 316 in safety wire 502. A non-zero net current flowing through opening 313 may indicate the existence of a current leak in wire 108 between the fault sensing and driver modules 300,400.

In response to a detected current leak, fault detector 330 may generate a current leakage indication, which may be used to cause the primary current in current wire 108 to be interrupted. As shown in FIG. 3, a leakage indication may be communicated from fault detector 330 to a circuit interrupter 340, which in response may cut off the current in wire 108 from transmitter 102. The signal may be provided via connection 318 or in any other manner. In some embodiments, circuit interrupter 340 may comprise a relay or other type of switch 342 for interrupting current flow. For example, the embodiment of FIG. 3 comprises current wire 108 electrically coupled to transmitter 102 by way of current wire 108a. Relay 342 operates to selectively couple and decouple wires 108 and 108a. Circuit interrupter 340 may remain in a current interrupting state until the occurrence of an event, for example upon a reset operation of interrupter 340.

In some embodiments, fault detection system 200 may include a third sensor 360 for sensing the primary current flowing in the current wire 108 at the location of fault sensing module 300. In some embodiments, sensor 360 may be similar to or the same as the current sensors of fault sensing module 300 or driver module 400. Current sensor 360 may define an opening 363 and may comprise an output 364 for outputting a signal providing an instantaneous representation of the total current flowing through current wire 108 at the location of fault sensing module 300. The output signal may be proportional to the primary current in current wire 108. In some embodiments, output 364 may be connected to fault detector 330, which may comprise components for processing, storing or transmitting the signal. Output 364 may be connected to fault detector 330 via connection 320. The output signal may provide data that may be used to refine the algorithms for fault detection, for geophysical post processing of data, or for any other suitable purpose. In some embodiments, sensor 360 may include a core 362, such as a magnetically permeable core.

Although current sensors in the above embodiments are described as having cores or magnetically permeable cores, this is not meant to be limiting. Embodiments having current sensors that do not have magnetically permeable core are also contemplated.

Figure 4:
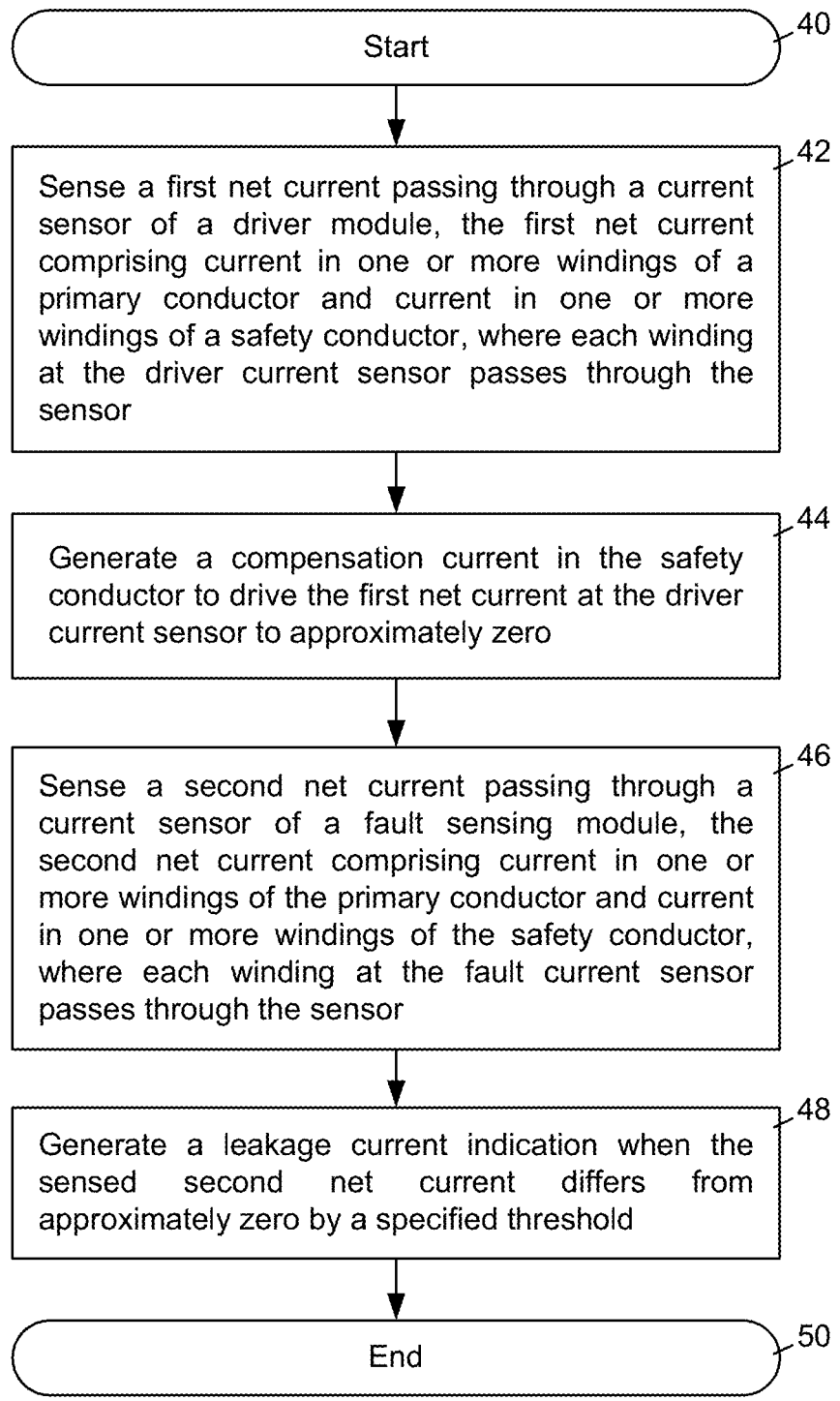
FIG. 4 is a flow diagram representing a process for detecting a fault according to an embodiment of the present disclosure.

FIG. 4 is a flow diagram directed to a process for detecting a fault according to at least one embodiment of the present disclosure.

The process begins at block 40 and proceeds to block 42 where a first net current passing through a current sensor of a driver module is sensed. The first net current may comprise current in one or more windings of a primary conductor and current in one or more windings of a safety conductor, where each winding at the driver current sensor passes through the sensor.

The process then proceeds to block 44, where a compensation current is generated in the safety conductor to drive the first net current at the driver current sensor to approximately zero.

The process then proceeds to block 46, where a second net current passing through a current sensor of a fault sensing module is sensed. The second net current may comprise current in one or more windings of the primary conductor and current in one or more windings of the safety conductor, where each winding at the fault current sensor passes through the sensor.

The process then proceeds to block 48, where a leakage current indication is generated when the sensed second net current at the fault sensing module differs from approximately zero by a specified threshold. A non-zero net current flowing through the current sensor at the fault sensing module may indicate the existence of a current leak in the primary conductor between the fault sensing module and the driver module. The leakage current indication may be signaled to a circuit interrupter to interrupt the primary current in the primary conductor.

The process then proceeds to block 50 and ends.

Although the embodiment represented in FIG. 4 includes a particular number and order of operations, these are not meant to be limiting. One or more of the order of the operations, the number of operations, and the operations themselves may be different in other embodiments. The embodiment of FIG. 4 is therefore only an example and is not meant to be limiting.

In some embodiments, digital computing components may be used. For example, some embodiments may implement fault detector 330 (see FIG. 3) at fault sensing module 300 using one or more digital components.

Figure 5:
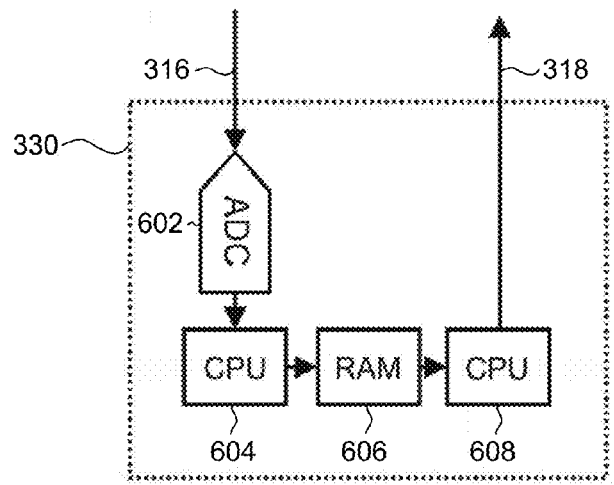
FIG. 5 is a block diagram representing an example embodiment of fault detector according to the present disclosure.

FIG. 5 is a block diagram representing one example embodiment of fault detector 330. Detector 330 may comprise a single channel analog to digital converter (ADC) 602, which may receive input from sensor 310 via connection 316. A first processing unit 604 or other device may drive ADC 602 and store data received from ADC 602 into a buffer in a memory, such as a dual-ported random access memory (RAM) 606. A second processing unit 608 or other device may receive and process the data. The processing may include filtering, such as for example filtering out spikes in the output signal from sensor 310 at transitions of a duty-cycle waveform, as previously described. In addition, the processing may include analyzing the data to detect output from sensor 310 that represents a likely ground fault event. The analyses may involve comparing the processed data to a threshold value and identifying a current leak when the output value exceeds (or in other embodiments, is below) the threshold.

Second processing unit 608 may signal or otherwise indicate a current leak to a circuit interrupter 340 (see FIG. 3) via connection 318 or in any other manner. Circuit interrupter 340 may, in response, cut off the current in wire 108 from transmitter 102. In some embodiments, connection 318 may be a single logic line, which may be held high to drive relay 342 through circuit interrupter 340.

In addition, fault detector 330 may be powered by a battery and power supply circuit (not shown). The power supply may be configured so that the output line 318 will be driven low if the battery power falls below a threshold voltage required for proper operation. This will signal circuit interrupter 340 to decouple transmitter 102 from current wire 108 when fault detector 330 is not operating.

Fault detector 330 in the embodiment of FIG. 5 may have other components, but they are not shown for the sake of simplicity.

Figure 6:
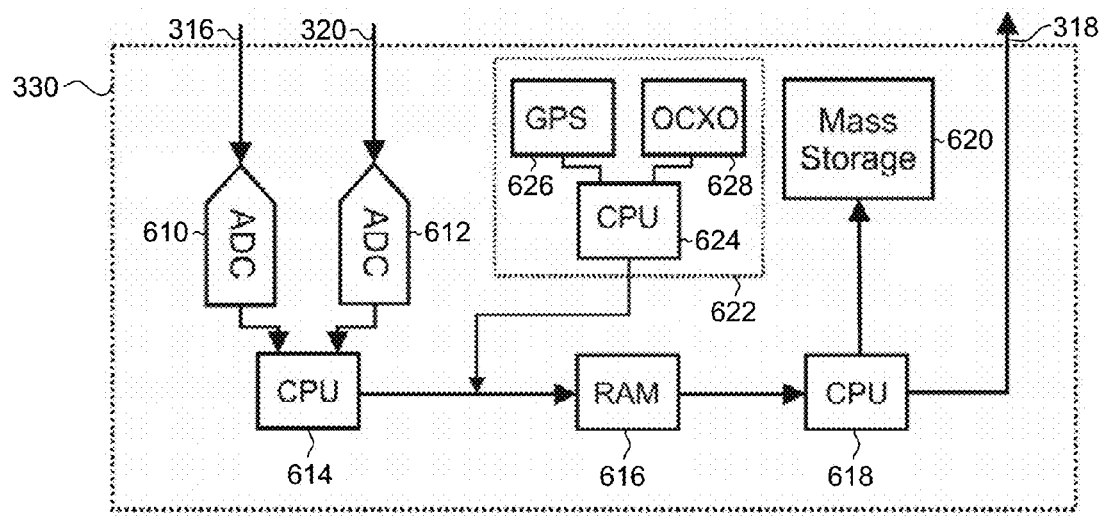
FIG. 6 is a block diagram representing another example embodiment of fault detector according to the present disclosure.

FIG. 6 is a block diagram representing another example embodiment of fault detector 330. In this embodiment, detector 330 comprises first and second single channel analog to digital converters (ADC) 610, 612. First ADC 610 may receive input from sensor 310 via connection 316 for detecting a current leak in current wire 108. Second ADC 612 may receive input from sensor 360 via connection 320 representing the primary current in current wire 108. Sensors 310 and 360 are shown in FIG. 3.

Referring again to FIG. 6, a first processing unit 614 or other device may drive first and second ADCs 610, 612, and store data outputted from one or both of the ADCs into a buffer in a memory, such as a dual-ported RAM 616. In some embodiments, fault detector 330 may include a timing module 622 for providing timing information to be associated with data received at the fault detector 330. The timing information may be in the form of time stamps, and the timing information may be stored in RAM 616 in association with the data from one or both ADCs 610, 612.

Timing module 622 may include one or more of a processing unit 624, an oscillator 628 such as an oven-controlled crystal clock, and a positioning unit 626 for receiving timing signals for time synchronization with other systems or for other timing purposes. The positioning unit 626 may be capable of receiving Global Positioning System (GPS) signals and thus may comprise a GPS radio or receiver. However, other embodiments may comprise one or more components for receiving timing signals other than from GPS signals.

Fault detector 330 may further comprise a second processing unit 618 for receiving and processing the data from RAM 616. The processing at processing unit 618 may be similar to the processing performed by second processing unit 608 previously described with reference to the embodiment shown in FIG. 5. Furthermore, the signaling of a current leak to circuit interrupter 340 via connection 318 in the embodiment of FIG. 6 may also be similar to the signaling previously described with reference to FIG. 5.

Fault detector 330 may further include memory for storing data, such as a mass storage device 620. The data stored in device 620 may include one or more of data relating to output from fault detection sensor 310, data corresponding to output from primary current sensor 360, and timing related data from timing module 622.

Mass storage device 620 may be any suitable type of memory, including non-volatile storage. In some embodiments, device 620 may comprise one or more removable non-volatile memory units or cards, which may be removed for storage or future analysis of fault sensing data. For example, this type of stored data may allow for the identification of near-fault occurrences, which may be indicative of poor wire insulation or poor installation practices.

Fault detector 330 in the embodiment shown in FIG. 6 may have additional components, but they are not shown for the sake of simplicity.

Figure 7:
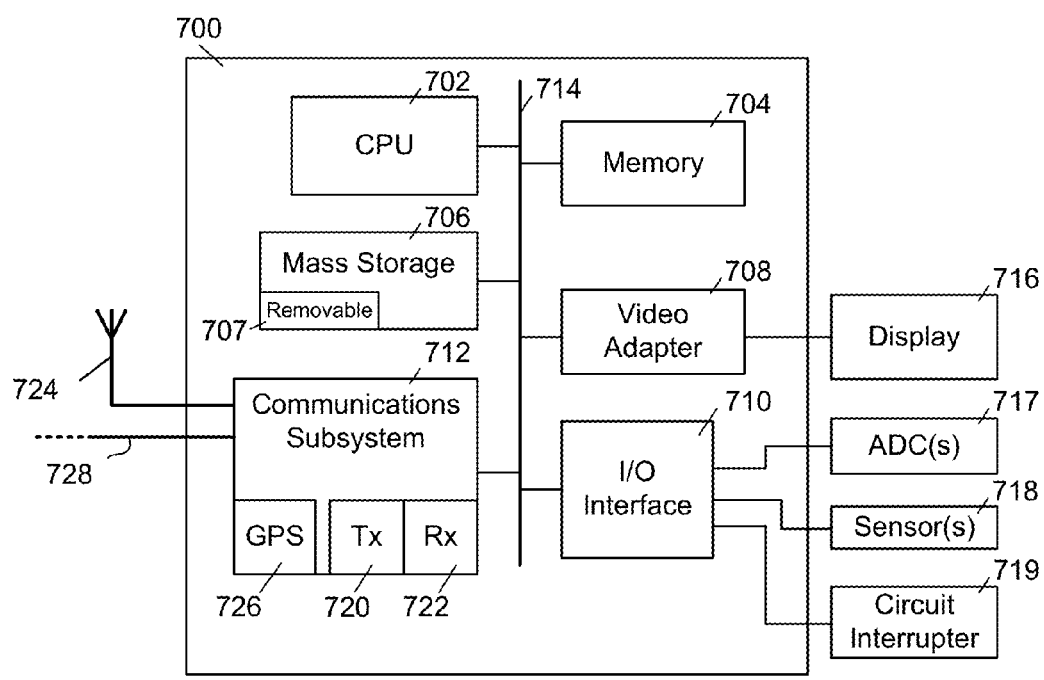
FIG. 7 is a block diagram of an example processing system that may be used in or with some embodiments of the present disclosure.

Reference is now made to FIG. 7, which is a block diagram of an example processing system 700. The example processing system or components thereof may be used with or in any embodiment according to the present disclosure. For example, in some embodiments, fault detector 330 may be implemented using a processing system, or components thereof, similar to system 700.

Processing system 700 may include one or more of a processing unit, such as a central processing unit (CPU) 702, memory 704, a mass storage device 706, a video adapter 708, an I/O interface 710, and a communications subsystem 712. One or more of the components or subsystems of processing system 700 may be interconnected by way of one or more buses 714 or any other suitable connection.

Bus 714 may be one or more of any type of several bus architectures including a memory bus or memory controller, a peripheral bus, video bus, or the like. The CPU 702 may comprise any type of electronic data processor or processors, including but not limited to microprocessors and microcontrollers. The CPU 702 may be used for any suitable purpose, including processing data and controlling one or more components of system 700. In some embodiments, one or more CPUs 702 may implement one or more of processing units 604, 608, 614, 618, 624 of FIG. 5 and FIG. 6.

Memory 704 may comprise any type of system memory such as static random access memory (SRAM), dynamic random access memory (DRAM), synchronous DRAM (SDRAM), read-only memory (ROM), a combination thereof, or the like. In an embodiment, the memory may include ROM for use at boot-up, and DRAM for program and data storage for use while executing programs. In some embodiments, one or more memories 704 may implement one or more of RAM modules 606, 616 of FIG. 5 and FIG. 6.

The mass storage device 706 may comprise any type of storage device configured to store data, programs, and other information and to make the data, programs, and other information accessible via the bus 714 or other interconnection. The mass storage device may comprise, for example, one or more of a solid state drive, hard disk drive, a magnetic disk drive, an optical disk drive, or the like. In some embodiments, mass storage device 706 may include or consist of one or more removable units 707, such as one or more non-volatile memory units or cards. In some embodiments, mass storage device 706 may implement mass storage device 620 of FIG. 6.

The video adapter 708 and the I/O interface 710 may provide interfaces to couple external input and output devices to the processing system. As illustrated, examples of input and output devices include a display 716 coupled to the video adapter 708 and the analog to digital converter(s) (ADC) 717 coupled to the I/O interface 710. In addition, one or more sensors 718 may be coupled to I/O interface 710. The one or more sensors 718 may include any suitable type of sensor, including but not limited to one or more sensors referred to herein, including one or more current sensors at one or more of fault sensing module 300 and driver module 400. Furthermore, an I/O interface 710 of system 700 may be connected or coupled to one or more circuit interrupters 719, such as current interrupter 340 in FIG. 3. It is to be appreciated, however, that these peripherals and other devices are examples only. Other devices may be coupled or connected to the processing system in addition to or in place of those shown and described, including but not limited to one or more light emitting diodes (LEDs), speakers, or microphones. Furthermore, additional or fewer interfaces may be utilized. For example, one or more serial interfaces such as Universal Serial Bus (USB) (not shown) may be provided.

A communications subsystem 712 may be provided for one or both of transmitting and receiving signals. In some embodiments, a fault detection system according to the present disclosure may utilize a communication subsystem for one or both of sending and receiving information with another computer or system, which may be located remotely from the fault detection system. Communications subsystems may include any component or collection of components for enabling communications over one or more wired and wireless interfaces. Communications include communications over any suitable communication channel, communication link, or network including the Internet. The one or more wired or wireless interfaces may include but are not limited to USB, Ethernet, high-definition multimedia interface (HDMI), Firewire (e.g. IEEE 1394), Thunderbolt™, WiFi™ (e.g. IEEE 802.11), WiMAX (e.g. IEEE 802.16), Bluetooth™, or Near-field communications (NFC), as well as General packet radio service (GPRS), Universal Mobile Telecommunications System (UMTS), Long-Term Evolution (LTE), Long-Term Evolution Advanced (LTE-A), and dedicated short range communication (DSRC).

Communication subsystem 712 may include one or more ports or other hardware 728 for one or more wired connections. In addition, communication subsystem 712 may include one or more of transmitters 720, receivers 722, and antenna elements 724. In at least some embodiments, the processing system may have geographic positioning functionality, for example to determine a geographical position of the processing system or for receiving timing signals for time synchronization of the system with other systems. In at least some embodiments, the processing system may be capable of receiving Global Positioning System (GPS) signals. Therefore in at least one embodiment, as shown in FIG. 7, the processing system may comprise a positioning module 726, such as a GPS radio or receiver. However, other embodiments may comprise and use other subsystems or components for, for example, determining the geographical position of the processing system or for receiving timing signals for time synchronization or other timing purposes. In some embodiments, positioning module 726 may implement positioning unit 626 of FIG. 6.

The processing system 700 of FIG. 7 is merely an example and is not meant to be limiting. Some embodiments according to the present disclosure may use other components not shown or described but known to persons skilled in the art. Furthermore, a device may contain multiple instances of a component, such as multiple processing systems, processors, memories, transmitters, receivers, etc. Various other options and configurations are contemplated.

Through the descriptions of the preceding embodiments, the teachings of the present disclosure may be implemented by using hardware only or by using a combination of software and hardware. Software or other computer executable instructions for implementing one or more embodiments, or one or more portions thereof, may be stored on any suitable computer readable storage medium. The computer readable storage medium may be a tangible or in transitory/non-transitory medium such as optical (e.g., CD, DVD, Blu-Ray, etc.), magnetic, hard disk, volatile or non-volatile, solid state, or any other type of storage medium known in the art.

Computer executable instructions for implementing one or more embodiments may be provided to one or more processors of a computing device to produce a machine, such that the instructions, which execute by way of the processor of the computing device, create means for implementing functions according to the present disclosure.

Terms used herein such as connected, electrically connected, coupled, in signal communication, and so on may include direct connections between components, indirect connections between components, or both, as would be evident in the context of one or more embodiments. The term coupled generally includes but is not limited to a direct electrical connection.

Furthermore, the term "wire" as used herein is intended to include any suitable type or types of electrical conductors, and therefore is not meant to be limiting. Similarly, the term "cable" is intended to include any suitable type of electrical conductor, which may be insulated. A "cable" may also include an insulated electrical conductor having two or more conductors insulated from one another.

The structure, features, accessories, and alternatives of specific embodiments described herein and shown in the Figures are intended to apply generally to all of the teachings of the present disclosure, including to all of the embodiments described and illustrated herein, insofar as they are compatible. In other words, the structure, features, accessories, and alternatives of a specific embodiment are not intended to be limited to only that specific embodiment unless so indicated.

Reference(s) to an element in the singular, such as by use of the article "a" or "an" is not intended to mean "one and only one" unless specifically so stated, but rather "one or more".

The present disclosure is provided to enable any person skilled in the art to make or use the present teachings. Various modifications to embodiments described herein will be readily apparent to those skilled in the art, and the generic principles defined herein may be applied to other embodiments. The present disclosure is not intended to be limited to the embodiments shown herein, but is to be accorded the full scope consistent with the claims. All structural and functional equivalents to the elements of the various embodiments described throughout the disclosure that are known or later come to be known to those of ordinary skill in the art are intended to be encompassed by the elements of the claims.

Nothing disclosed herein is intended to be dedicated to the public regardless of whether such disclosure is explicitly recited in the claims. Furthermore, nothing herein is intended as an admission of prior art or of common general knowledge. In addition, citation or identification of any document in this application is not an admission that such document is available as prior art, or that any reference forms a part of the common general knowledge in the art.

What is claimed:

1. An apparatus for sensing a leakage current between first and second locations along a primary conductor carrying a primary current, the apparatus comprising:
   a safety conductor;
   a driver module positioned at the second location along the primary conductor, comprising:
      a closed-loop driver current sensor for sensing a first net current passing through the sensor, the primary conductor comprising a first one or more windings, each of the first one or more windings passing through the driver current sensor, the safety conductor comprising a second one or more windings, each of the second one or more windings passing through the driver current sensor,
      the first net current comprising a sum of total current sensed in the primary conductor and total current sensed in the safety conductor by the driver current sensor,
      wherein the driver module provides a compensation current in the safety conductor at the driver current sensor so that the total current passing through the driver current sensor in the first one or more windings of the primary conductor is compensated by the total current passing through the sensor in the second one or more windings of the safety conductor to drive the first net current at the driver current sensor to approximately zero; and
   a fault sensing module positioned at the first location along the primary conductor, comprising:
      a fault current sensor for sensing a second net current passing through the fault current sensor, the primary conductor comprising a third one or more windings, each of the third one or more windings passing through the fault current sensor, the safety conductor comprising a fourth one or more windings, each of the fourth one or more windings passing through the fault current sensor, the second net current comprising a sum of total current in the primary conductor and total current sensed in the safety conductor by the fault current sensor, the fault current sensor providing an output signal proportional to the second net current; and a fault detector for receiving the output signal of the fault current sensor and generating a leakage current indication in response to the second net current at the fault sensing module differing from approximately zero by a specified threshold.

2. The apparatus of claim 1, further comprising a circuit interrupter for interrupting the primary current in the primary conductor in response to receiving a leakage current indication from the fault detector.

3. The apparatus of claim 1, wherein the fault sensing module further comprises:
an analog to digital converter for digitizing the output signal of the fault current sensor; and
a processor for analyzing the converted digital signal for detecting a leakage current in the primary conductor.

4. The apparatus of claim 3, wherein the processor is configured to identify a false leakage current event based on the output signal of the fault current sensor caused by distributed capacitance of the safety conductor occurring at sharp transitions in the primary current.

5. The apparatus of claim 3, wherein the fault sensing module further comprises a memory for storing data corresponding to the converted digital signal.

6. The apparatus of claim 1, wherein the fault sensing module further comprises, in addition to the fault current sensor, a third current sensor for sensing the primary current in the primary conductor, and wherein the fault detector receives output from the third current sensor and stores data corresponding to the primary current sensed by the third sensor in a memory.

7. The apparatus of claim 1, wherein at least one of the driver current sensor and the fault current sensor comprises a flux gate current sensor comprising a magnetically permeable core surrounding an opening of the sensor wherein the primary and safety conductors pass through the sensor by passing through the opening.

8. The apparatus of claim 1, wherein the primary conductor electrically couples a transmitter to a ground electrode in a ground surveying system.

9. The apparatus of claim 8, wherein the fault sensing module is positioned near the transmitter and the driver module is positioned near the ground electrode.

10. The apparatus of claim 1, wherein at least one of the driver sensor and the fault current sensor comprises a Hall Effect current sensor.

11. The apparatus of claim 1, wherein at least one of the driver sensor and the fault current sensor comprises a current transformer or a current transducer.

12. The apparatus of claim 1, wherein the driver module comprises an amplifier arranged in a feedback configuration.

13. The apparatus of claim 1, wherein the fault current sensor of the fault sensing module provides an output signal proportional to the second net current, the second net current being approximately zero when a ratio of the first number of windings to the second number of windings is equal to a ratio of the third number of windings to the fourth number of windings and when the current sensor of the driver module is driven to zero.

14. A method for sensing a leakage current between first and second locations along a primary conductor carrying a primary current, the method comprising:
sensing a first net current passing through a current sensor of a driver module positioned at the second location along the primary conductor, the primary conductor comprising a first one or more windings, each of the first one or more windings passing through the current sensor of the driver module, wherein a safety conductor comprises a second one or more windings, each of the second one or more windings passing through the current sensor of the driver module,
the first net current comprising a sum of total current sensed in the primary conductor and total current sensed in the safety conductor by the driver current sensor;
generating a compensation current in the safety conductor to drive the first net current at the current sensor of the driver module to approximately zero;
sensing a second net current passing through a current sensor of a fault sensing module positioned at the first location along the primary conductor, the primary conductor comprising a third one or more windings, each of the third one or more windings passing through the current sensor of the fault sensing module, the safety conductor comprising a fourth one or more windings, each of the fourth one or more windings passing through the current sensor of the fault sensing module,
the second net current comprising a sum of total current in the primary conductor and total current sensed in the safety conductor by the fault current sensor, the fault current sensor providing an output signal proportional to the second net current; and
generating a leakage current indication in response to the sensed second net current at the fault sensing module differing from approximately zero by a specified threshold.

15. The method of claim 14, further comprising interrupting the primary current in the primary conductor in response to a leakage current indication.

16. The method of claim 14, further comprising:
converting an output signal of the current sensor of the fault sensing module from analog to digital, wherein the output signal is proportional to the second net current, wherein generating the leakage current indication comprises analyzing, at a processor, the converted digital signal for detecting a leakage current in the primary conductor.

17. The method of claim 16, further comprising:
identifying, at the processor, a false leakage current event based on the output signal caused by distributed capacitance of the safety conductor occurring at sharp transitions in the primary current.

18. The method of claim 16, further comprising storing, in computer memory, data corresponding to the converted digital signal.

19. The method of claim 14, further comprising:
sensing, by a third current sensor, the primary current in the primary conductor at the first location along the primary conductor; and
storing, in computer memory, data corresponding to the primary current sensed by the third sensor.

20. The method of claim 14 wherein at least one of the current sensor of the driver module and the current sensor of the fault sensing module comprises a flux gate current sensor comprising a magnetically permeable core surrounding an opening of the sensor wherein the primary and safety conductors pass through the sensor by passing through the opening.

21. The method of claim 14, wherein the primary conductor electrically couples a transmitter to a ground electrode in a ground surveying system.

22. The method of claim 14, wherein a ratio of the first number of windings to the second number of windings is the same as a ratio of the third number of windings to the fourth number of windings.

* * * * *